Feb. 16, 1971 D. H. COVILL 3,564,421

AERIAL ARRAYS

Filed Oct. 11, 1967 3 Sheets-Sheet 2

3,564,421

AERIAL ARRAYS

Dennis Henry Covill, Halifax County, Nova Scotia, Canada, assignor to E.M.I. Electronics Canada Limited, Ottawa, Ontario, Canada, a company of Canada Filed Oct. 11, 1967, Ser. No. 674,478
Claims priority, application Great Britain, Dec. 21, 1966, 57,111/66; June 14, 1967, 27,352/67
Int. Cl. H04b *1/06*
U.S. Cl. 325—367 4 Claims

ABSTRACT OF THE DISCLOSURE

A directional array of aerials is disclosed incorporating a plurality of untuned loop aerials which are substantially inductive over the working frequency range of the array and a plurality of transistor amplifiers arranged in grounded base configurations. Each one of the loop aerials is effectively connected in series with the emitter lead of a respective one of the transistor amplifiers, and means are provided for combining signals from the collectors of the transistor amplifiers to form an output signal, the aerials being arranged, and the transistor amplifiers being coupled to the combining means, with gain and phase characteristics which provide a predetermined directional pattern for the array.

The present invention relates to aerial arrays, in particular to arrays incorporating loop aerials and is especially but not exclusively applicable to receiving arrays.

A loop aerial includes one or more turns of conductor wound on an air core or a core of high permeability magnetic material, and it normally has linear dimensions which are small in comparison with the wavelength of the signal to be received. A loop aerial derives energy by coupling with the magnetic field component of radio signals threading the loop, and to improve the gain of the aerial, the loop is normally used as the inductance of a resonant circuit tuned to the frequency of the desired radio signals by means of a suitable capacitor. However, the tuning of the aerial in this way has the disadvantage that it will only operate efficiently over a narrow band of frequencies around the resonant frequency, and it has a very low gain outside this band so that wide band operation is not possible without adjustable tuning.

On the other hand, if to obtain operation over a wide band of frequencies the loop aerial is operated aperiodically it lacks the increase in gain due to tuning and although the low level of the output signal of the aerial may be remedied by amplification, the noise introduced by the amplifier may be sufficient to render the output signal to noise ratio of the amplifier unacceptably low.

It is an object of the present invention to provide an aerial array incorporating loop aerials in which the above difficulty may be reduced.

According to the invention there is provided a directional array of aerials incorporating a plurality of untuned loop aerials which are substantially inductive over the working frequency range of the array, a plurality of transistor amplifiers arranged in grounded base configurations, wherein each of said loop aerials is effectively connected in series with the emitter lead of a respective one of said transistor amplifiers, and means for combining signals from the collectors of said transistor amplifiers to form an output signal, said aerials being arranged, and said transistor amplifiers being coupled to said combining means, with gain and phase characteristics which provide a predetermined directional pattern for said array.

Figure 1:
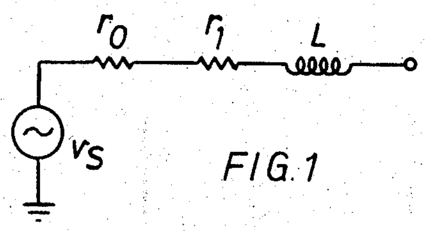
Figure 2:
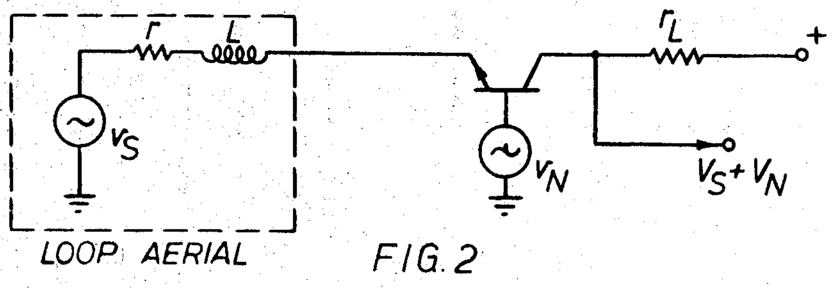
Figure 3:
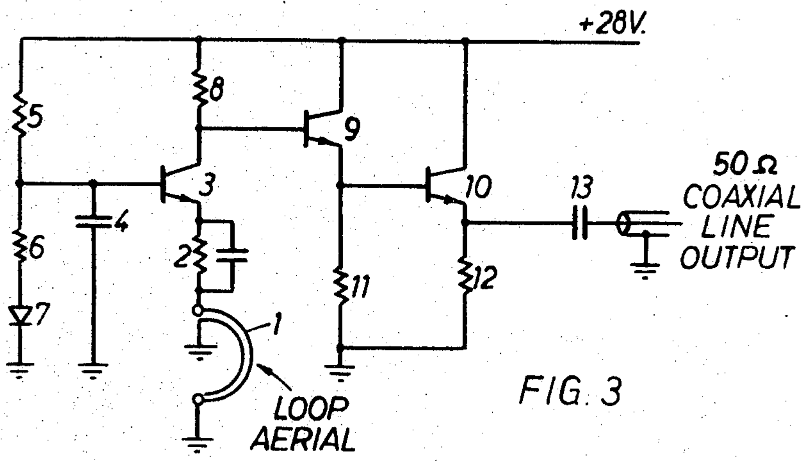
Figure 4:
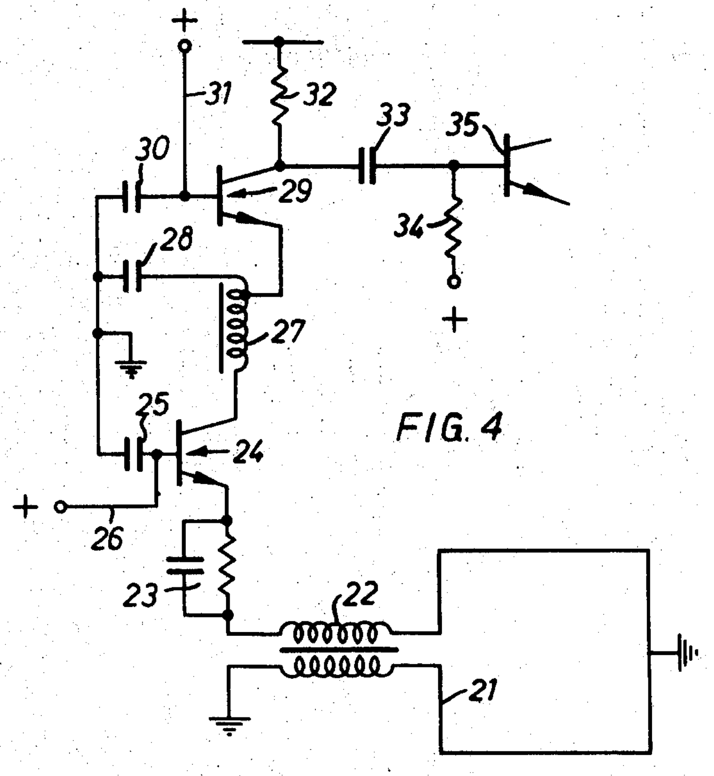
Figure 5:
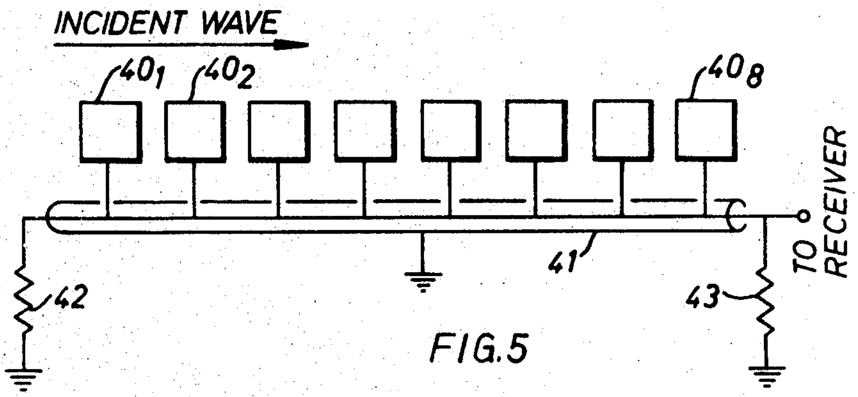
Figure 6:
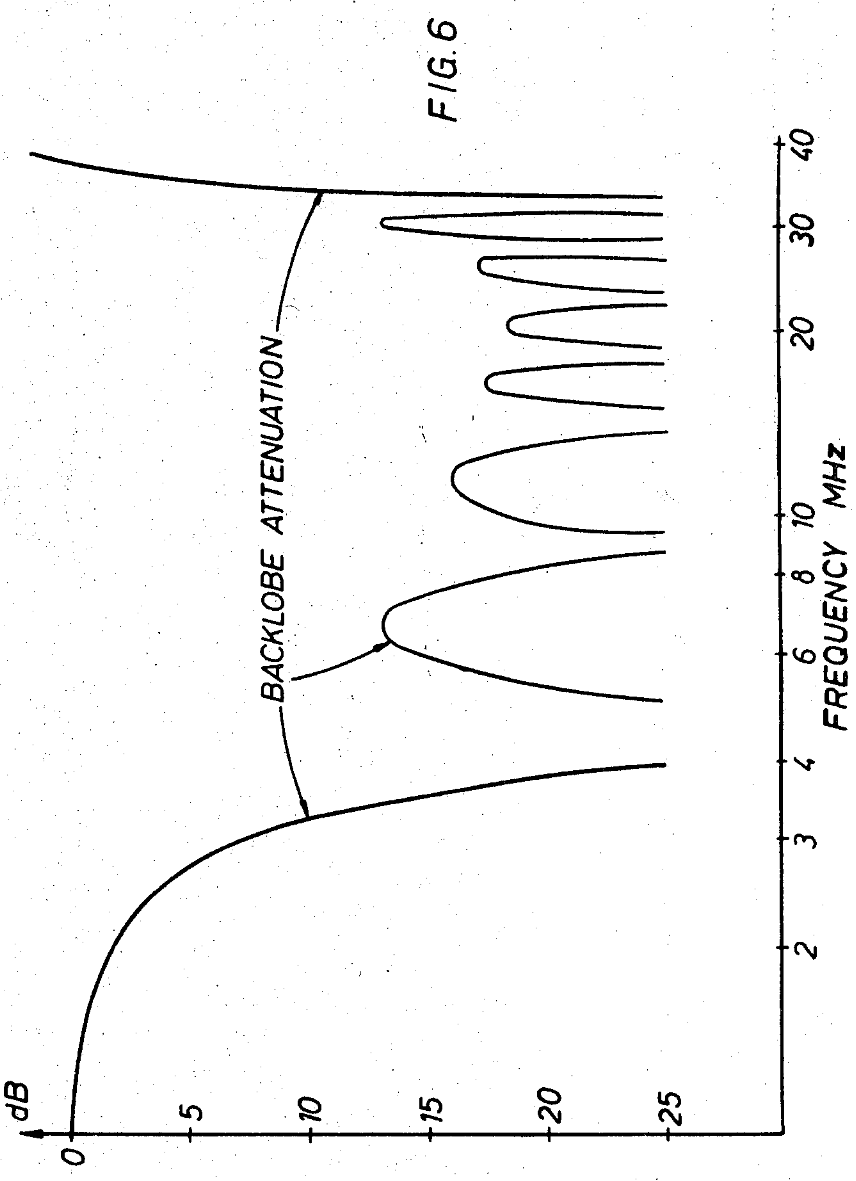

In order that the invention may be fully understood and readily carried into effect it will now be described with referenec to the drawings of which:

FIG. 1 is an equivalent circuit diagram of an untuned loop aerial,

FIG. 2 is an outline circuit diagram for explanatory purposes showing a loop aerial connected in the emitter lead of a transistor amplifier arranged in a grounded base configuration, FIG. 3 is a more detailed circuit diagram of a practical form of the arrangement shown in FIG. 2, FIG. 4 illustrates a preferred circuit arrangement of loop aerial and grounded base transistor amplifier for use in directional aerial arrays according to the present invention, FIG. 5 is a diagrammatic view of a directional arrangement according to one example of the present invention, and FIG. 6 is a diagram illustrating the response of the array shown in FIG. 5.

FIG. 1 shows the equivalent circuit of a loop aerial where:

$v_s$=induced signal voltage in the loop
$r_0$=radiation resistance of the loop
$r_1$=loss resistance of the loop
L=inductance of the loop In an incident electro-magnetic field strength of $\epsilon$ microvolts/metre, with a wavelength=$\lambda$ metres, the induced signal voltage, with the loop correctly oriented, is given by:

$$v_s=\frac{2\pi n\mu A}{\lambda}\epsilon \text{ microvolts}$$

where:

$n$=number of turns in the loop
$\mu$=rod permeability of the core
A=loop area (square metres)

For a given design of loop, this may be simplified to:

$v_s=jk\omega\epsilon$ where:

k=constant $\omega$=signal angular frequency

If the loop is terminated with a low resistance of $r_2$ ohms then the available signal across this termination will be:

$$v_0=\frac{v_s r_2}{r_2+r_1+r_0+j\omega L}=\frac{jk\omega\epsilon r_2}{r_2+r_1+r_0+j\omega L}$$

and if $\omega L \gg (r_2+r_1+r_0)$, that is to say if the loop impedance is predominantly inductive at the signal frequency $\omega$ (Condition 1), this reduces to $$\frac{k\epsilon r_2}{L}$$

This expression shows a linear relationship between output voltage and incident field strength which is independent of frequency. Unfortunately, however, the signal voltage is highly attenuated and probably too small, at low incident field strengths, to feed into a conventional receiver.

Consider the arrangement shown in FIG. 2.

Here the loop aerial is connected directly in series with the emitter lead of a grounded-base transistor amplifier. At a suitable value of emitter current, the input impedance at the emitter terminal in this configuration will appear as a low dynamic resistance ($r_e$). This will correspond to the termination $r_2$ referred to above.

The noise voltage in a diffused silicon transistor is generated primarily in the base-emitter region and may be shown, as in FIG. 2, as a noise voltage generator ($v_n$) connected in the base lead. From FIG. 2, we will have a signal output voltage at the transistor collector given very closely by:

$$V_s=v_s\frac{r_L}{j\omega L}$$

(if Condition 1 applies)

$$=\frac{k\epsilon r_L}{L}$$

The output noise voltage at this collector will similarly be given by:

$$V_N=v_n\frac{v_L}{j\omega L}$$

Hence $$V_s/V_N=v_s/v_n$$

From which it is clear that the signal/noise ratio of the output signal produced at the collector is not influenced by the highly reactive impedance ($j\omega$L) of the loop aerial. As it is connected in the emitter lead the impedance of the loop aerial has reduced the transistor noise $V_N$ by negative feedback, in the same proportion as the wanted signal $v_s$ has been reduced by the low resistance of the emitter input impedance connected as termination of the loop aerial.

FIG. 3 shows a detailed circuit diagram of a preamplifier and loop aerial siutable for a typical receiver operating in the band 3 to 30 mc./s. This arrangement has been used successfully to receive H.F. signals propagated over a path length of some 5,000 miles. It was also shown to be markedly superior to a conventional whip aerial commonly used as a wide-band H.F. receiving antenna.

In FIG. 3, the loop aerial 1, which consists of a single turn of coaxial cable connected as a balun wound on a two foot by two foot square frame, is connected in series with the condenser and resistor combination 2 in the emitter lead of the transistor 3. The base electrode of the transistor 3 is earthed for high frequencies by condenser 4, and is biassed by a potentiometer including resistors 5 and 6 and a diode 7 serving to effect temperature stabilisation of the working point of the arrangement. The collector electrode of the transistor 3 has a load resistor 8 and is connected to the base electrode of transistor 9 arranged as an emitter follower amplifier, directly driving a second emitter follower amplifier including the transistor 10. Transistors 9 and 10 have emitter load impedances 11 and 12. The output signal is taken via a 50 ohm coaxial line connected by condenser 13 to the emitter electrode of transistor 10.

A further feature of this untuned loop aerial arrangement is that the loop couples very poorly with free space in its untuned mode of operation, and in accordance with the invention several loops may be very closely stacked and connected in series with the emitter leads of respective grounded base transistor amplifiers to form directional arrays with negligible mutual coupling between adjacent loops. Moreover, the problem of array phasing is greatly simplified by the aperiodic transfer characteristic of the untuned loop.

FIG. 5 illustrates one form of aerial array according to the invention, FIG. 4 illustrating one of the elementary loop aerial arrangements included in the array illustrated in FIG. 5. The arrangement according to FIG. 4 is similar in principle to that shown in FIG. 3, and comprises a loop aerial 21 which consists of square loop having a single turn of conductor, the conductor being ⅛ inch thick and 8 inches wide, and the sides of the loop being two feet long. The loop 21 is connected by a balun transformer 22 and condenser and resistor combination 23 to the emitter of a transistor 24. The base electrode of the transistor 24 is earthed for high frequencies by capacitor 25 and is biassed via lead 26. The collector electrode of the transistor 24 has a load inductor 27 connected in series with capacitor 28 and a tapping on the inductor 27 is connected to the emitter of a further transistor 29 which is also operated in grounded base configuration. The base of transistor 29 is earthed for high frequencies by capacitor 30 and biassed via lead 31. The transistor 29 has a load resistor 32 capacitively coupled, via capacitor 33 having a lead resistor 34 to the base of a further amplifying transistor 35.

As illustrated in FIG. 5, a plurality of loop aerials and amplifiers according to FIG. 4, are connected to form a directional arrangement array. Respective loop aerials and amplifiers are represented by blocks $40_1$, $40_2$ . . . eight such aerials and amplifiers being provided in this example of the invention. The amplifying transistors 35 feed their output signals directly onto an air-dielectric coaxial line 41. The aerials form a linear array and the aerial arrangements have closely defined gain and phase characteristics for providing a predetermined directional pattern for the array. The line 41 is matched at both ends by equal impedances 42 and 43, the impedance 43 constituting the input impedance of a receiver. The array therefore has a directional node pointing away from the receiver end of the line 41 towards the other end. The amplifying transistors 35 for the respective loops have their collectors connected to the line 41, so that they operate with high output impedances and are effective current sources. The doubly terminated line 41 is the collector load of the amplifying transistors 35. The linear array, because of its capability for giving front-to-back gain, corresponds in performance to log periodic arrays, and rhombic type aerials. Nevertheless it requires less space and has advantage of portability and ease of erection.

FIG. 6 is a diagram of the theoretical reverse characteristic of the eight aerial array with a spacing between successive aerials of 13 feet, giving a total array length of 91 feet. The diagram shows a front-to-back gain exceeding 13 db from 3½ to 32 mHz. Greater directivity at lower frequencies could be achieved by increasing the overall length of the array. The forward sensitivity of the array is like a single loop in that it is in large measure independent of frequency. The system noise factor, that is the ratio of the total noise power at the receiver output to the noise at the receiver output originating from the array source resistance, is lower than for a simple loop and the overall system sensitivity is increased by the directivity gain factor.

The invention is applicable to other linear arrays of loop aerials and both horizontal and vertical loop orientations are possible. A loop aerial orientated with the loop plane vertical will receive vertically polarised signals with a "figure of eight" directional pattern in an azimuthal plane. With the loop plane horizontal it will receive horizontally polarised signals with an omni-directional pattern in the azimuthal plane. Both orientations are usable at high frequency (H.F.) but with the restriction, common to all horizontal aerial structure at H.F., that when using the horizontal reception mode the aerial array must be mounted high above the ground to prevent signal cancellation due to ground reflection at some frequencies. With vertical orientation this restriction does not apply and the aerial array may be mounted close to the ground.

Moreover instead of using a uniform array, the arrangement may be arranged to give a desired form of amplitude taper or variation, for example to minimise side lobes. The amplifier circuit may also differ in details from that illustrated in FIG. 4.

What I claim is:

1. A directional array of aerials incorporating a plurality of untuned loop aerials which are substantially inductive over the working frequency range of the array, a plurality of transistor amplifiers arranged in grounded base configurations, wherein each of said loop aerials is effectively connected in series with the emitter lead of a respective one of said transistor amplifiers, and means for combining signals from the collectors of said transistor amplifiers to form an output signal, said aerials being arranged, and said transistor amplifiers being coupled to said combining means, with gain and phase characteristics which provide a predetermined directional pattern for said array.

2. An array according to claim 1 wherein said combining means comprises a transmission line, and a plurality of coupling amplifiers, each of said coupling amplifiers being arranged as an effective current source for feeding the signal from the collector of a respective one of said transistor amplifiers into said transmission line.

3. An array according to claim 2 wherein said transmission line comprises an air-dielectric transmission line.

4. An array according to claim 1 wherein said aerials are arranged in a linear array.

References Cited

UNITED STATES PATENTS 3,051,952 2/1962 Pifer .............. 343—741

OTHER REFERENCES

Rheinfelder, W. A. Design of Low-Noise Transistor Input Circuits, January 1964, pp. 132–133, FIG. 8–1.

RICHARD MURRAY, Primary Examiner

K. W. WEINSTEIN, Assistant Examiner